United States Patent
Talbot

(10) Patent No.: US 7,248,125 B1
(45) Date of Patent: Jul. 24, 2007

(54) POLY-PHASE VCO WITH RAIL TO RAIL OUTPUT VOLTAGE SWING AND DUTY CYCLE CONTROL ACROSS TUNING RANGE

(75) Inventor: Gerald Robert Talbot, Concord, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 11/033,759

(22) Filed: Jan. 13, 2005

(51) Int. Cl.
*H03K 3/03* (2006.01)

(52) U.S. Cl. .......................... 331/57; 331/45; 327/269; 327/284

(58) Field of Classification Search .................. 331/57, 331/45; 327/158, 161, 284, 269
See application file for complete search history.

(56) References Cited

U.S. PATENT DOCUMENTS

| | | | |
|---|---|---|---|
| 6,963,250 B2 * | 11/2005 | Ngo et al. ..................... | 331/57 |
| 2005/0225400 A1 * | 10/2005 | Yoneya ........................ | 331/57 |
| 2005/0237122 A1 * | 10/2005 | Gu .............................. | 331/57 |

OTHER PUBLICATIONS

"AMD-3181™ Hyper Transport™ PCI-X® Tunnel Data Sheet", 24637 Rev. 3.02, Aug. 10, 2004, pp. 1-87.

* cited by examiner

*Primary Examiner*—Robert Pascal
*Assistant Examiner*—Levi Gannon
(74) *Attorney, Agent, or Firm*—Manelli Denison & Selter PLLC; Leon R. Turkevich

(57) ABSTRACT

An even number phase ring oscillator having at least eight, equally spaced phases. The oscillator includes at least eight stages, defining at least four pairs of stages, with each pair including a first stage and an associated second stage. The first stages are arranged such that an output of a first stage defines a primary input of another first stage, with the output of the first stage of the last pair defining the primary input of the second stage of the first pair. The second stages are arranged such that an output of a second stage defines a primary input of an another second stage, with the output of the second stage of the last pair crossing over the output of the first stage of the last pair and defining a primary input of the first stage of the first pair, thereby defining a closed loop. A first cross connection is provided between an output of each first stage of each pair and an input of each associated second stage, and a second cross connection between an input of each first stage of each pair and an output of each associated second stage, thereby ensuring that the oscillator provides an odd number inversions around the loop. A feed forward connection is provided between and input of each (n) stage and an output of each (n+2) stage, with (n) being any one of the stages, so as to provide a feed forward input to each stage to increase a speed at which an output of each stage switches.

12 Claims, 4 Drawing Sheets

POLY-PHASE VCO WITH RAIL TO RAIL OUTPUT VOLTAGE SWING AND DUTY CYCLE CONTROL ACROSS TUNING RANGE

BACKGROUND OF THE INVENTION

1. Field of the Invention

The present invention relates to a voltage-controlled oscillator (VCO) suitable for use in a monolithic CMOS phase lock loop that generates an even number of equally spaced phases for use with other circuitry.

2. Background Art

Most modern VLSI components have a phase lock loop (PLL) to multiply-up an external clock reference to a frequency that is used to clock the inside of the part. A component of the PLL is a voltage-controlled oscillator (VCO) that takes, as an input, an analog voltage that determines its output frequency. Thus, the VCO is a free running oscillator that is put in a feedback loop to control its operating frequency. Typically, the PLL is a multiplying PLL so that a low frequency external reference clock is multiplied up to some higher frequency. For example, a 200 MHz external reference clock is multiplied up to a range of 1.6 to 2.4 GHz.

A convention ring oscillator is typically employed as a VCO for CMOS technology. The conventional ring oscillator consists of a string of inverters having their supply controlled by a control voltage. The conventional ring oscillator requires an odd number of inverters that provides an odd number of phases.

If a VCO is used in a circuit to control the phase of an output signal digitally, an even number of phases is preferred that are equi-distance spaced along the period of oscillation. Since the conventional ring oscillator provides an odd number of phases, it is not suited to control the phase of an output signal digitally.

Differential ring oscillators have been built, suffer from small voltage swings and thus require level conversion and have frequency range limitations.

SUMMARY OF THE INVENTION

There is a need to provide an even number phase generator that generates a minimum of eight phases and provides a good voltage control of the oscillation frequency and is able to maximize the oscillation frequency using a feed forward technique.

These and other needs are attained by the present invention, where an even number phase ring oscillator having at least eight, equally spaced phases, includes at least eight stages, defining at least four pairs of stages, with each pair including a first stage and an associated second stage. The first stages are arranged such that an output of a first stage defines a primary input of another first stage, with the output of the first stage of the last pair defining the primary input of the second stage of the first pair. The second stages are arranged such that an output of a second stage defines a primary input of an another second stage, with the output of the second stage of the last pair crossing over the output of the first stage of the last pair and defining a primary input of the first stage of the first pair, thereby defining a closed loop. A first cross connection is provided between an output of each first stage of each pair and an input of each associated second stage, and a second cross connection is provided between an input of each first stage of each pair and an output of each associated second stage, thereby ensuring that the oscillator provides an odd number inversions around the loop. A feed forward connection is provide between and input of each (n) stage and an output of each (n+2) stage, with (n) being any one of the stages, so as to provide a feed forward input to each stage to increase a speed at which an output of each stage switches.

Another aspect of the present invention is a method of providing an even number phase ring oscillator having at least eight, equally-spaced phases. The method provides at least eight stages constructed and arranged to define a primary oscillation closed loop, and to ensure that an odd number inversions is provided around the closed loop although one inversion occurs in each stage. A feed forward connection is provided between one stage and another stage that is one logical inversion earlier than the one stage. An input is fed to each stage via each feed forward connection to increase a speed at which an output of each stage switches.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1:
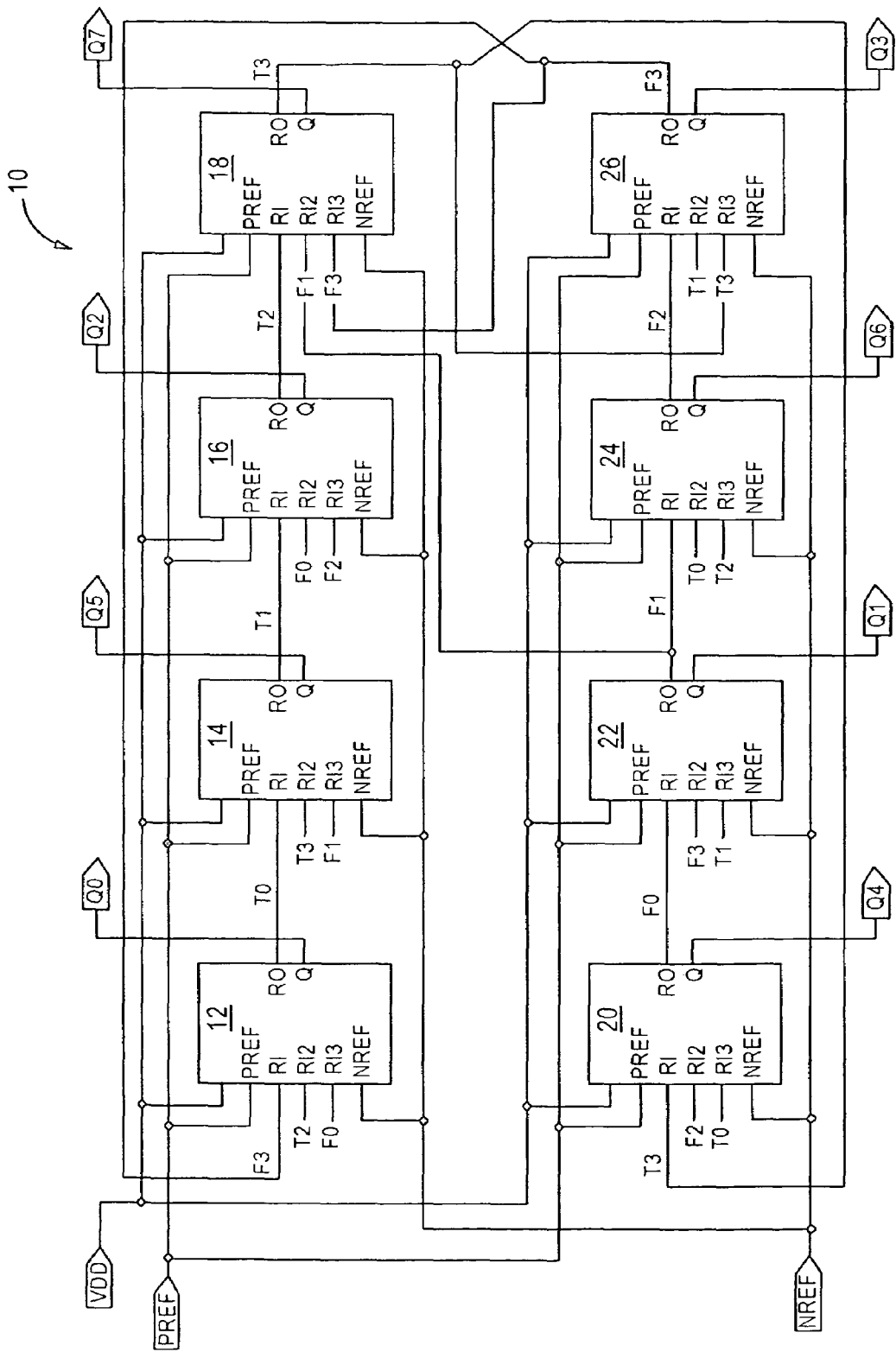
FIG. 1 is a diagram illustrating an eight-phase ring oscillator according to an embodiment of the present invention.
Figure 3:
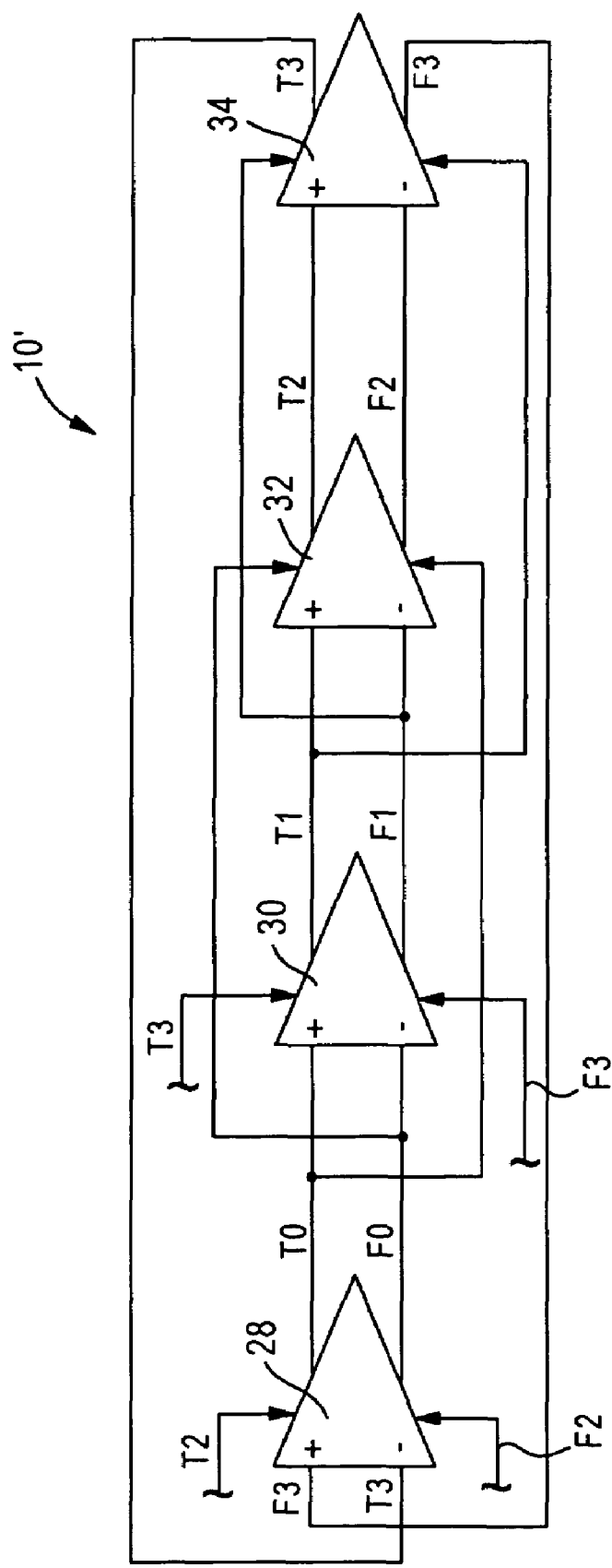
FIG. 3 is a diagram of a differential ring oscillator that is the equivalent of the oscillator in FIG. 1.

With reference to FIG. 1, an eight-phase ring oscillator having equally spaced phases is shown, generally indicated at 10, according to an embodiment of the present invention. As shown, at least eight stages are provided and are indicated at 12, 14, 16, 18, 20, 22, 24 and 26. In the embodiment, the eight stages define four pairs of stages arranged in a vertical manner. Each pair of stages includes a first stage and a second stage, with each pair being considered a differential gain stage of differential limiting amplifier. Thus, as shown in FIG. 3, differential limiting amplifier 28 represents first stage 12 and second stage 20 of FIG. 1, differential limiting amplifier 30 represents first stage 14 and second 22 of FIG. 1, differential limiting amplifier 32 represents first stage 16 and second stage 24 of FIG. 1, and differential limiting amplifier 34 represents first stage 18 and second stage 26 of FIG. 1.

In FIG. 1, for clarity of illustration, all signal connections lines are not shown. It can be appreciated that, for example, T1 output from stage 14 in the upper portion of the figure is connected to T1 input to stage 22 in the lower portion of the figure, F1 input to 14 in the upper portion of the figure is connected to F1 output to stage 22 in the lower portion of the figure and so on. The row of first stages 12, 14, 16 and 18 is the logical complement of row of second stages 20, 22, 24 and 26.

With reference to FIG. 1, a primary oscillation closed loop will be defined. A first primary input signal F3 at RI of stage 12 becomes RO, which outputs signal T0 as a primary input RI to stage 14, which becomes RO of stage 14. RO of stage 14 outputs stage T1 as a primary input RI to stage 16, which becomes RO that outputs signal T2 as a primary input RI to stage 18, which becomes RO of stage 18. RO of stage 18 outputs signal T3 that crosses over signal F3 to become the primary input RI of stage 20. Stage 20 outputs F0, stage 22 outputs F1, stage 24 outputs F2 and stage 26 outputs F3, which crosses over signal T3 and becomes the primary input of stage 12 at RI to close the loop.

There is one inversion in each stage between RI and RO. Since there are eight inversions in the loop, an oscillator is not formed since an odd number of inversions is required to form an oscillator. An even number of inversions creates a latch which will store either an all "1" or an all "0" state. A latch is formed also by each differential limiting amplifier 28, 30, 32 and 34 (FIG. 3) since each differential limiting amplifier includes and even number of stages, namely two. Thus, without any other input, each differential limiting amplifier would sit in one state. Hence, there is a first latch that goes around all eight stages and four shorter latches, each around two respective stages (e.g., stages 18 and 26 which is differential limiting amplifier 34).

In order to prevent a latch from occurring, as shown in FIG. 1, RI3 (input) of stage 18 is connected with RO (output) of stage 26 and RO (output) of stage 18 is connected to RI3 (input) of stage 26. This cross connection is provided between each pair of stages, namely, in addition to stages 18 and 26, between stages 16 and 24, between stages 14 and 22 and between stages 12 and 20. Thus, each of the pairs of cross-coupled stages can each be considered as a corresponding differential amplifier of FIG. 3 and connections around the loop make a differential ring oscillator 10' (FIG. 3) with an odd number of inversions around the loop, using an even number of stages. Since the cross-couple between stages 18 and 26, for example, has a much shorter propagation path than the longer path (through all eight stages), the shorter path manages to establish the state of the output such that T3 and F3 (and T2 and F2, and T1 and F1, and T0 and F0) are always complements or opposites of each other.

With reference to FIG. 1 referring to stages 18 and 22, there is a connection between RI2 of stage 18 to RO of stage 22. This connection is labeled F1 and F1 is an early version of T2 (they are in the same phase). Thus, there is a feeding forward of an earlier stage (n) in the oscillator 10 to an output stage (n+2) that increases the speed at which a stage (e.g., in the example, stage 18) switches, increasing the frequency of oscillation. A feed forwarding connection is provided for each phase between RI2 and RO, as is apparent from FIG. 1. Feed forward connections F0, F1, F2 and F3 are shown in the differential ring oscillator 10' of FIG. 3 and are connected one logical inversion earlier. Without these feed forward connections, the frequency of oscillation of the oscillator 10 would be determined by the delay of each of the stages 18 and 26, 16 and 24, 14 and 22, and 12 and 20. By feeding forward an earlier phase, the phase switches faster and the net result is that the propagation delay of each stages reduces. This in turn increases the frequency of oscillation of the oscillator 10.

At least eight phases are required since eight phases have been determined to provide enough gain around the loop for the oscillator 10 to sustain oscillation.

Figure 2:
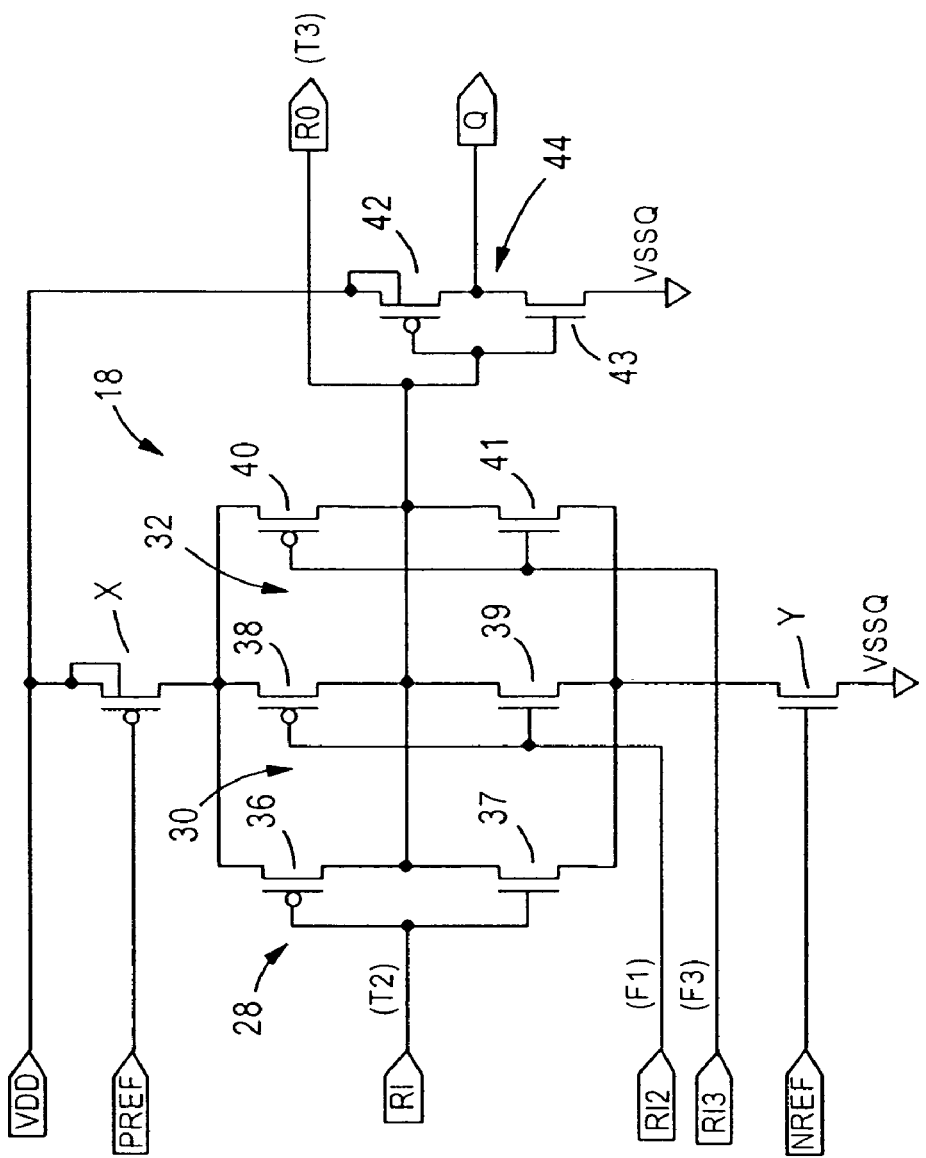
FIG. 2 is a diagram illustrating one stage of the oscillator of FIG. 1.

FIG. 2 shows one stage, e.g., stage 18 of the oscillator 10 of FIG. 1. The other stages are configured similarly. As shown, three inverters, 28, 30 and 32 have their outputs connected in parallel. Thus RI is an input to the first inverter 28, RI2 is an input to the second inverter 30, and RI3 is an input to the third inverter 32. RO is the output for stage 18, for example, is T3. Input RI3 causes the outputs of stage 18 and stage 26 to be in opposite phase with respect to each other. In operation, the signal at RI2 occurs one-quarter of a cycle earlier than the signal at RI. As a result, the output RO switches sooner than it would otherwise switch when employing RI alone. Thus, the output switching is started sooner than it should. It is noted that if RI never switched, RI2 is not sufficient to cause RO to switch.

With reference to FIG. 2, NREF is used to control the frequency at which oscillator 10 oscillates. The voltage on NREF determines the amount of current supplied to the transistors 36-41. To ensure that the waveform on the output has a symmetrical rise and fall time, PREF is adjusted such that transistor X supplies the same current as transistor Y that is being controlled by NREF. With this circuit, the stage delay is adjusted, but, at the same time, the output voltage RO is permitted to swing rail to rail e.g., VDD to VSS). The transistors 42 and 43 that drive Q define a simple inverter 44 that buffers a signal to go to the next stage. The current supplied by PREF and NREF is equal such that the rising edge and falling edge of the oscillator 10 have the same slew rate. As a result, the inverter 44 will generate a square wave output. Thus, no level shifting is required from the oscillator 10 to the rest of the logic.

Figure 4:
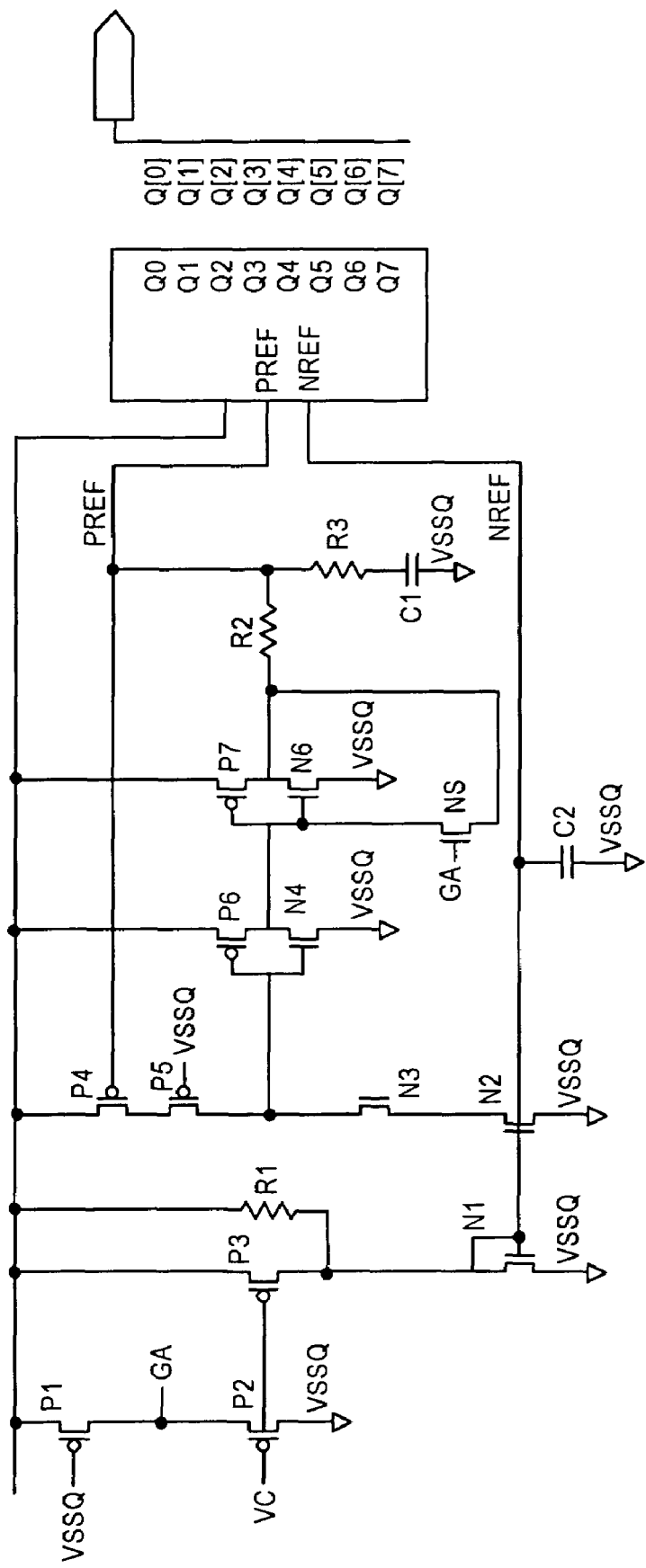
FIG. 4 is a diagram illustrating a bias generator according to an embodiment of the present invention.

With reference to FIG. 4, to ensure that the rise and fall times of the oscillator 10 are the same, a bias generator provides PREF and NREF. VC is the primary voltage control for the oscillator, in other words, VC controls NREF directly. PREF is established as a function of the voltage on NREF. As NREF changes, PREF changes to make the current supplied equal in pull-up and pull-down.

Thus, it can be appreciated that each stage of oscillator 10 has three high frequency inputs, RI used for the primary ring oscillator path, RI2 used as a feed forward path to speed-up the frequency of oscillation, and RI3 used to ensure that the oscillator starts-up in the correct mode as a four stage differential oscillator. The two bias inputs PREF and NREF control the strength of the N pull-down and the P pull-up of the stage, which in turn, determine the frequency of oscillation. A final output RO buffers each stage of the ring oscillator 10, proving a rail to rail output voltage swing.

The oscillator 10 is suitable for use in a monolithic CMOS phase lock loop that generates at least eight equally spaced phases that can be used with other circuitry such as a phase interpolator to generate fine phase granularity. The oscillator 10 preferably has an operating frequency in a range of 1.5 GHz to 2.5 GHz making it suitable for high-speed serial communication and for on-chip clock generation. The frequency of oscillation can be controlled by changing a delay of each individual stage of the oscillator. Since each stage has an identical delay, four differential clocks are created which provides eight phases around a ring.

Since the oscillator 10 forms a differential limiting amplifier, it generates a substantially full voltage swing (rail to rail) instead of swinging over only a portion of the supply range. Thus, level shifting is not needed. The oscillator 10 also provides good voltage control of the oscillation frequency and is able to maximize the oscillation frequency using the feed forward technique discussed above.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. An even number phase ring oscillator having at least eight, equally spaced phases, comprising:
   at least eight stages, defining at least four pairs of stages, with each pair including a first stage and an associated second stage, the first stages being arranged such that an output of a first stage defines a primary input of another first stage, with the output of the first stage of the last pair defining the primary input of the second stage of the first pair, and the second stages being arranged such that an output of a second stage defines a primary input of an another second stage, with the output of the second stage of the last pair crossing over the output of the first stage of the last pair and defining a primary input of the first stage of the first pair, thereby defining a closed loop,
   a first cross connection between an output of each first stage of each pair and an input of each associated second stage, and a second cross connection between an input of each first stage of each pair and an output of each associated second stage, thereby ensuring that the oscillator provides an odd number inversions around the loop, and
   a feed forward connection between an input of each (n) stage and an output of each (n+2) stage, with (n) being any one of the stages, so as to provide a feed forward input to each stage to increase a speed at which an output of each stage switches,
   wherein two bias inputs are provided to control a strength of N pull-down and P pull-up of each stage.

2. The oscillator of claim 1, further comprising an inverter at each stage to buffer an output of each stage that defines the primary input, thereby providing substantially a rail-to rail output voltage swing.

3. The oscillator of claim 1, wherein at each stage, the feed forward input is configured to be one-quarter of a cycle earlier than the primary input.

4. The oscillator of claim 1, wherein the two bias inputs are configured to ensure that current supplied in pull-up and pull-down is equal, so as to ensure that a rise and fall times of the oscillator are the same.

5. An even number phase ring oscillator having at least eight equally-spaced phases, comprising:
   at least eight stages, defining at least four pairs of stages, with each pair including a first stage and an associated second stage, each stage having a primary input and an output, such that when eight stages are provided, the output of the first stage of the first pair defines the primary input of the first stage of the second pair, and the output of the first stage of the second pair defines the primary input of the first stage of third pair, and the output of the first stage of the third pair defines the primary input of the first stage of the fourth pair, the output of the first stage of the fourth pair defines the primary input of the second stage of the first pair, the output of the second stage of the first pair defines the primary input of the second stage of the second pair and the output of the second stage of the second pair defines the primary input of the second stage of the third pair and the output of the second stage of the third pair defines the primary input of the second stage of the fourth pair, with the output of the second stage of the fourth pair crossing over the output of the first stage of the fourth pair and defines the primary input of the first stage of the first pair, thereby defining a closed loop,
   a first cross connection between an output of each first stage of each pair and an input of each associated second stage, and a second cross connection between an input of each first stage of each pair and an output of each associated second stage, thereby ensuring that the oscillator provides an odd number inversions around the loop, and
   a feed forward connection between and input of each (n) stage and an output of each (n+2) stage, with (n) being any one of the stages, so as to provide a feed forward input to each stage to increase a speed at which an output of each stage switches,
   wherein two bias inputs are provided to control a strength of N pull-down and P pull-up of each stage.

6. The oscillator of claim 5, further comprising an inverter at each stage to buffer an output of each stage that defines the primary input, thereby providing substantially a rail-to rail output voltage swing.

7. The oscillator of claim 5, wherein at each stage, the feed forward input is configured to be one-quarter of a cycle earlier than the primary input.

8. The oscillator of claim 5, wherein the two bias inputs are configured to ensure that current supplied in pull-up and pull-down is equal, so as to ensure that a rise and fall times of the oscillator are the same.

9. A method of providing an even number phase ring oscillator having at least eight, equally-spaced phases, the method including:
   providing at least eight stages constructed and arranged to define a primary oscillation closed loop, and to ensure that an odd number inversions is provided around the closed loop although one inversion occurs in each stage,
   providing a feed forward connection between an input of each (n) stage and an output of each (n+2) stage, with (n) being any one of the stages,
   feeding an input to each stage via each feed forward connection to increase a speed at which an output of each stage switches, and
   providing two bias inputs to control a strength of N pull-down and P pull-up of each stage.

10. The method of claim 9, further including buffering the output of each stage that defines the primary input, thereby providing substantially a rail-to-rail output voltage swing.

11. The method of claim 9, wherein the fed input is fed one-quarter of a cycle earlier than a primary input.

12. The method of claim 9, further ensuring that current supplied in pull-up and pull-down is equal, so as to ensure that a rise and fall times of the oscillator are the same.

* * * * *